(12) United States Patent
Massopust et al.

(10) Patent No.: US 7,575,302 B2
(45) Date of Patent: Aug. 18, 2009

(54) CIRCUITRY FOR PRINTER

(75) Inventors: Dan L. Massopust, Powell Butte, OR (US); Curtis D. Keller, West Linn, OR (US); Steven R. Slotto, Camas, WA (US); Peter J. Nystrom, Webster, NY (US); John R. Andrews, Fairport, NY (US); Steven V. Korol, Dundee, OR (US); Scott T. Treece, Portland, OR (US); Britton T. Pinson, Vancouver, WA (US); Chad J. Slenes, Sherwood, OR (US); Samuel Schultz, Wilsonville, OR (US); Lee M. Oien, Wilsonville, OR (US); Jonathan R. Brick, Tualatin, OR (US)

(73) Assignee: Xerox Corporation, Norwalk, CT (US)

( * ) Notice: Subject to any disclaimer, the term of this patent is extended or adjusted under 35 U.S.C. 154(b) by 400 days.

(21) Appl. No.: 11/304,367

(22) Filed: Dec. 14, 2005

(65) Prior Publication Data

US 2007/0132812 A1  Jun. 14, 2007

(51) Int. Cl.
*B41J 2/05* (2006.01)
(52) U.S. Cl. .......................................... 347/58; 347/59
(58) Field of Classification Search ................... 347/50, 347/56–59, 61–64, 67–78, 70, 71
See application file for complete search history.

(56) References Cited

U.S. PATENT DOCUMENTS 4,878,070 A * 10/1989 Watrobski .................... 347/58

* cited by examiner

*Primary Examiner*—Juanita D Stephens
(74) *Attorney, Agent, or Firm*—Marger Johnson & McCollom, P.C.

(57) ABSTRACT

A printing system includes a print head to deliver ink to an image receptor and at least one ink reservoir to deliver ink to the print head. Driving circuitry provides signals to the print head to control delivery of the ink and a flexible circuit interposed between the print head and the ink reservoirs connects the driving circuitry to the print head. The flexible circuit may include a heater to provide heat to the ink reservoirs. Alternatively, the flexible circuit may be replaced with a rigid substrate having a heater within its layers.

14 Claims, 4 Drawing Sheets

CIRCUITRY FOR PRINTER

BACKGROUND

Printing systems require interconnections between the print head and the driving circuitry. In ink jet systems, the circuitry provides the signals that cause the ink jets to delivery drops of ink to an image receptor. The ink jets reside in the print head and receive signals at an actuator that causes the jet to dispense ink. Each actuator generally corresponds to a jet, requiring that the signal traces from the driving circuitry also correspond to each actuator. Ensuring robust and properly aligned connections between the array of actuators and their driving circuits can prove challenging.

The use of solid inks may increase this challenge. Solid inks, as that term is used here, require heating to melt the ink into a liquid, jettable form. The addition of heat to the already complex alignment and connection challenges in these printing systems has given rise to a new set of challenges.

SUMMARY

A printing system includes a print head to deliver ink to an image receptor and at least one ink reservoir to deliver ink to the print head. Driving circuitry provides signals to the print head to control delivery of the ink and a flexible circuit interposed between the print head and the ink reservoirs connects the driving circuitry to the print head. The flexible circuit may include a heater to provide heat to the ink reservoirs.

A printing system includes a print head to deliver ink to an image receptor and at least one ink reservoir to deliver ink to the print head. The printing system includes a rigid substrate inserted into the print head and flexed to conform to contours of the print head and driving circuitry arranged on the rigid substrate to provide driving signals to the print head.

A method of providing a high-density interconnection between two members includes applying a layer of adhesive having an array of holes to a first member having a first set of contact pads such that the holes align with the contact pads. An adhesive, conductive material is then deposited into the holes and a second member having a second set of contact pads is aligned with the first member such that the second set of contact pads are aligned with the holes to form an assembly. A hot bar then bonds the first member to the second member.

DETAILED DESCRIPTION

Figure 1:
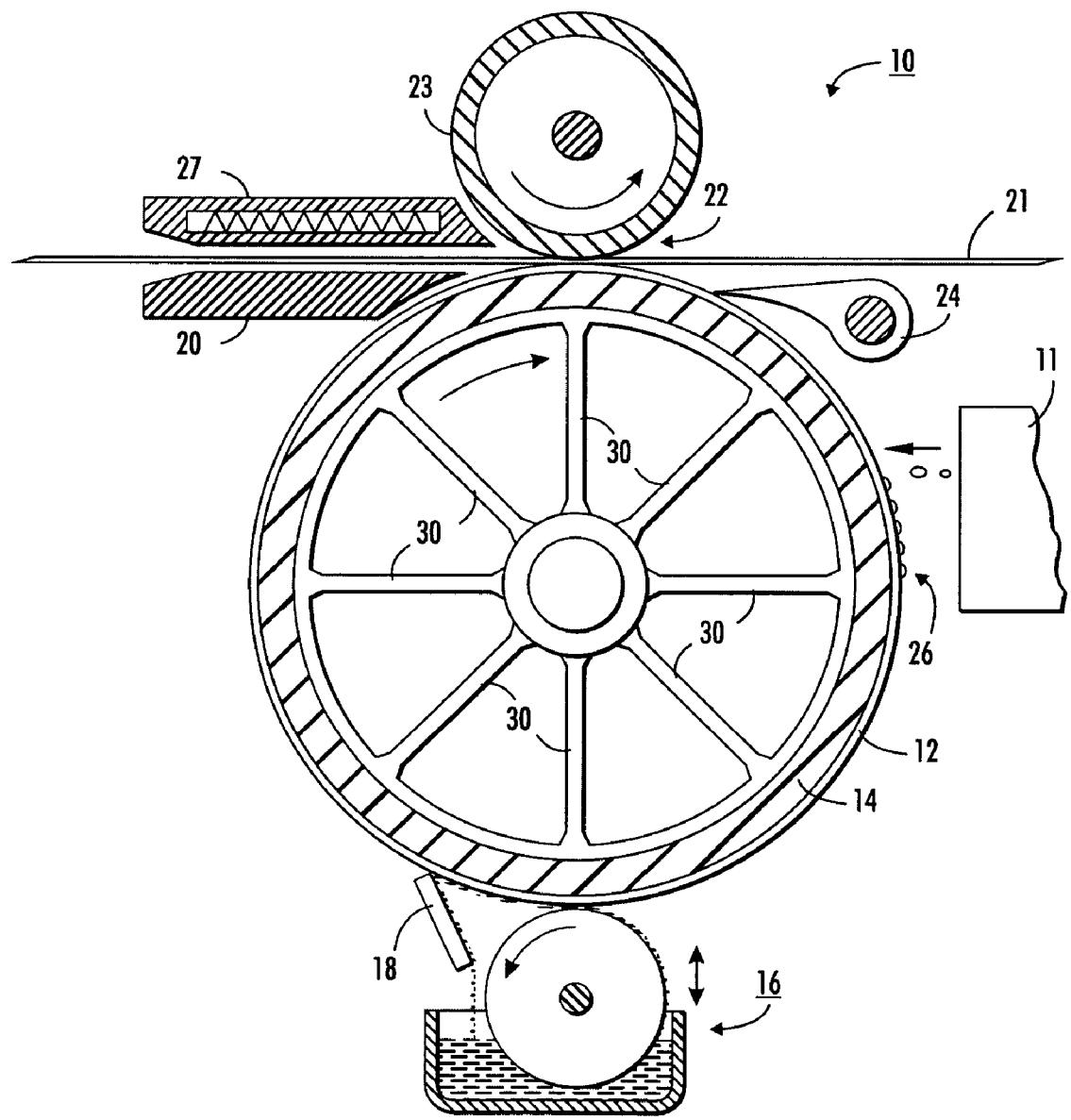
FIG. 1 shows a printing system.

FIG. 1 shows an example of a printing system. Printing system 10 transfers and inked image from an intermediate surface to some print media. A print head 11 places an ink in the liquid or molten state to form an image layer 26 on the surface of the image receptor 14. The surface of the image receptor 14 may be a liquid layer 12 applied using the applicator 18 and supported by support structure or drum 14 of the image receptor having supports 30. Applicator 18 may draw the liquid from a resevoir 16 to apply the liquid.

The print or recording medium 21 is guided by the guide 20 and heated by the heater 27. The preheated medium 21 receives the image from image layer 26 while the medium is in the space between the pressure roller 23 and the image receptor 14, referred to as the nip. As shown here, the gap 22 between the pressure roller 23 and the image receptor 14 will close to form the nip. The recording medium 21 may then be separated from the image receptor surface by the stripper finger 24.

Figure 2:
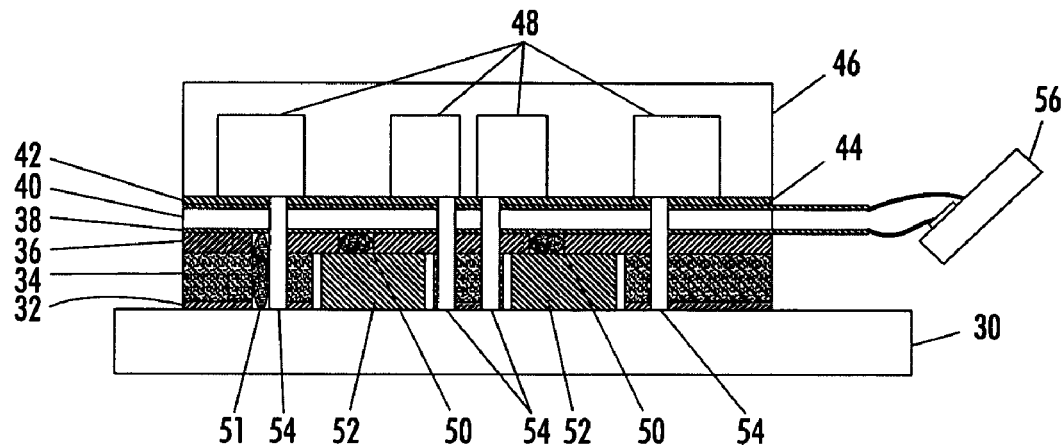
FIG. 2 shows a print head having a flexible circuit to provide interconnection and heat.

The jet stack generally will have an array of actuators or transducers arranged on it so as to cause the jets to deliver ink. The transducers may be of many different types, including piezoelectric transducers. For example, in thermal ink jet systems, the transducers could be heaters. A piezoelectric transducer may vibrate or otherwise move a diaphragm against a reservoir of ink, causing the ink to be forced out of the ink jet onto the image receptor. In FIG. 2, the jet stack 30 and some representative actuators 52 are shown. A layer of adhesive 32 adheres a spacer layer such as 34 to the jet stack. A standoff 36 allows for deposition of an adhesive conductive material 50 into holes or vias formed in the standoff. The standoff lies on the spacer layer and the actuators. The top surfaces of the standoff 36 and the actuators 52 are substantially coplanar.

A flexible circuit 40 has conductive contact pads, not shown, that connect to the actuators through the conductive adhesive material 50 to form an electrical and mechanical connection between the flex circuit and the jet stack. Copper traces 38 on a first side of the flexible circuit provide electrical connection between the circuitry that drives the printer on board 56 to the actuators through the material 50. Selection of the adhesive material for the standoff may include consideration of the use of a standoff as an electrical insulator. This provides further control of the connections between the contact pads, preventing any electrical connections other than in the vias formed in the standoff. A via for a common ground connection for the flex circuit and the jet stack is filled with a conductive, adhesive material drop 51 to complete that connection.

On the opposite side of the flex circuit from the traces 38 are traces 42 that form a heater. The traces form a heater based upon their resistance. For example, the heater may include several lines of a continuous trace in a zigzag or other tightly formed pattern. When the system provides power to this trace, the trace heats up and transfers heat to the ink reservoirs 48 contained in the manifold 46 and through conduction to the jet stack 30. The manifold 46 is attached to the flex cable by a manifold adhesive 44. Ink ports such as 54 allow ink to flow from the reservoirs to the jet stack.

Using a flex circuit with a heater formed on its surface eliminates another electrical and mechanical interface that would otherwise be necessary. If one were to use a separate heater, one would have to connect the heater to the flex circuit and then the jet stack to the flex circuit on one side and the manifold to the heater on the other side. Using a flex circuit with an integrated heater on one side and contact pads for the actuators on the other reduces chances of failure at the connections.

Further, the use of a flex circuit with copper traces allows for manufacture of a heater that is compatible with the manufacturing process of the flex circuit. It is also possible to manufacture the heater out of other metals and metal alloys. For example, Inconel®, a nickel alloy with chromium and iron trademarked and sold my Inco Alloys International, Inc. is a high temperature metal that may form an effective heater. The heater may be comprised of other materials as well.

Figure 3:
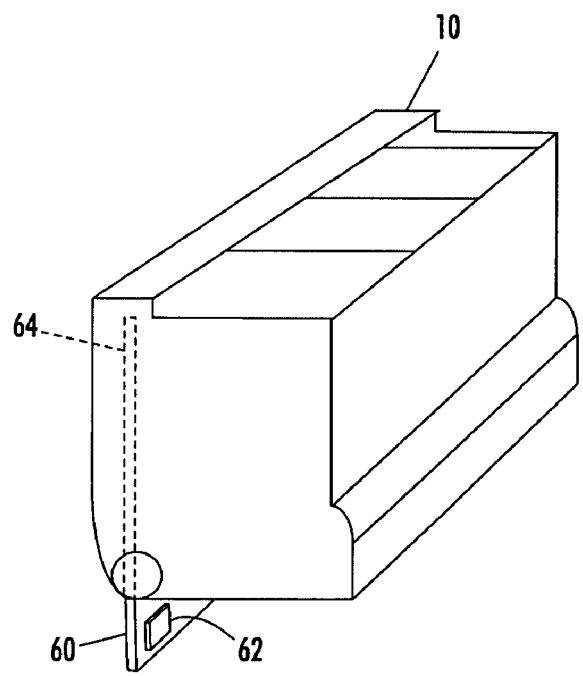
FIG. 3 shows print head having a rigid substrate.

In another embodiment, the flexible circuit may have an alternative in a rigid substrate, such as a printed circuit board. It is possible to flex a rigid substrate to match the contours of the interior of the print head much as the flexible circuit does. The use of a rigid substrate allows the driving circuitry to connect to the jet stack without the intervening flex cable. An embodiment of such a print head and rigid substrate is shown in FIG. 3.

The print head 10 has a printed circuit board or other rigid substrate 60 inserted into it, much like the flex cable, including in regions of high flex such as the region 64.

Experiments have proven that this flexing of the substrate provides sound connections between the substrate and the actuator array, as well as between the substrate and the drive electronics, which are typically integrated circuits mounted on the rigid substrate.

As discussed above the jet stack has an array of jets or ink outlets, each with its own actuator. Contact pads may reside on the rigid substrate to contact the actuator contact pads direction rather than through a flex cable. Similar to the flex cable, a standoff layer such as 36 in FIG. 2 may have vias or holes in it to allow connection between contact pads on the substrate and actuators on the print head.

Figure 4:
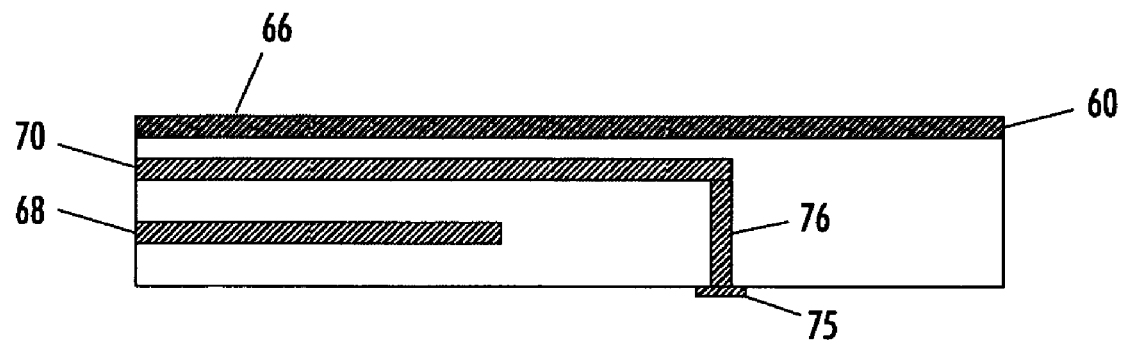
FIG. 4 shows a multilayered rigid substrate having a heater.

In addition to this direct contact, the use of a rigid substrate having multiple layers provides an opportunity for a heater. In a multi-layered substrate such as a printed circuit board, one may form a heater out of copper traces just as if it were another signal layer in the substrate. An example of this is shown in FIG. 4.

The substrate 60 has several layers, such as heater layers 66 and 68 and signal layer 70.

Signal layer 70 may also have a signal via 76 that allows transmission of signals to contact pad 75. Using more than one layer for heating allows for finer control of the temperature.

For example, due to the nature of the housings that hold the ink, the edges of the housing may act like a small heat sink or spreader that reduces the amount of heat applied to the ink in those regions. It is possible to have overlapping regions of heater layers, such as that shown by the overlap of layers 66 and 68, to increase the heat applied in a particular region.

Figure 5:
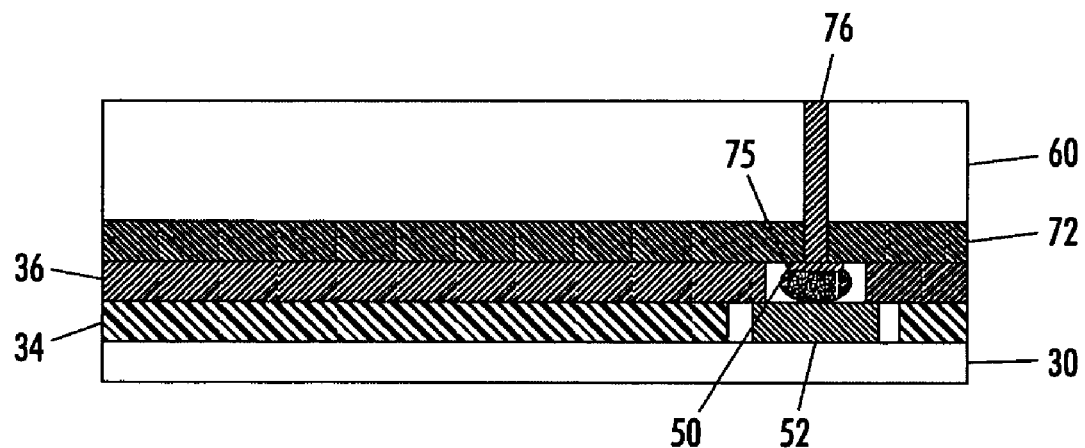
FIG. 5 shows a cross section of a rigid substrate having a heater.

FIG. 5 shows a more detailed view of the multi-layered, rigid substrate and the jet stack. For purposes of this figure, the substrate 60 has been simplified. Jet stack 30 connects to the substrate 60 through an actuator 52 and an adhesive, conductive material such as 50 to the signal via 76 through contact 75. Examples of adhesive conductive materials include a conductive paste, silver epoxy and low melt solder paste such as any indium alloy powders suspended in a flux. The standoff material 36 may be selected based upon its heat transfer properties. Depending upon the properties of the substrate 60, a heat spreader 72 may provide a more uniform heating and more efficient transfer of heat through the substrate.

One issue that may arise in taking advantage of the more direct connection with the rigid substrate is the robustness of the connection between the jet stack and the substrate. An embodiment of a connection between two members such as printed circuit boards is shown in FIG. 6, with an embodiment of a corresponding process in FIG. 7.

Figure 6:
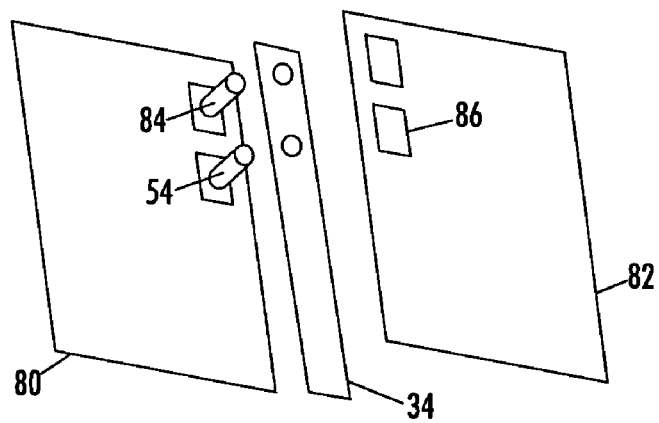
FIG. 6 shows a high density interconnection between two members.
Figure 7:
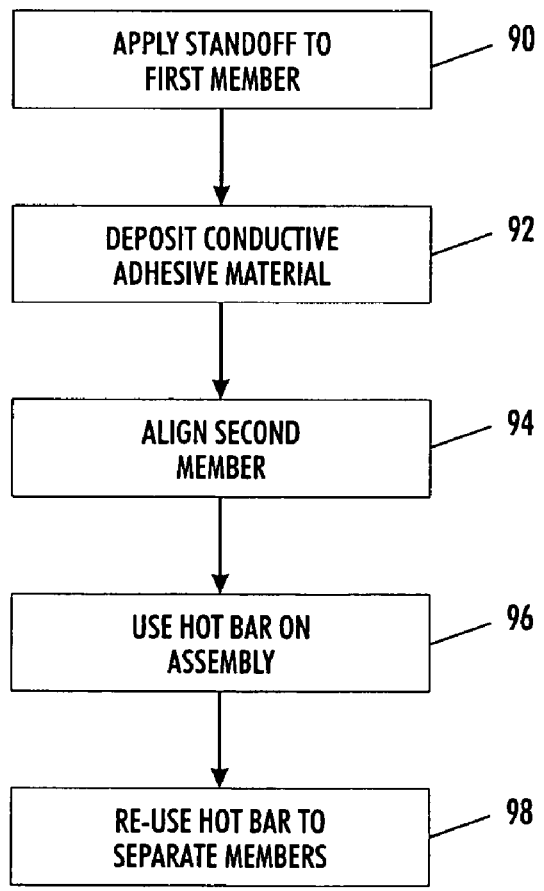
FIG. 7 shows a method of providing a high density interconnection between two members.

In FIG. 6, a first member 80 having a first set of contacts such as 84 receives an adhesive standoff layer in process 90 in FIG. 7. The adhesive may be a sheet adhesive having holes in it, such as that shown as 34 in FIG. 6. The holes in the adhesive allow for control of the application of the conductive, adhesive material. The conductive material 50 will fill in the holes in the sheet adhesive, providing potential electrical connection only where desired. The conductive, adhesive material is deposited at process 92 in FIG. 7. A second member 82 having a second set of contacts such as 86 is aligned with the drops of conductive material 50 in process 94 of FIG. 7. A hot bar, not shown, is then applied to the assembly of the first and second members in process 96 in FIG. 7 and forms an electrical and mechanical bond between the two members. The hot bar applies pressure and heat. Thermoset adhesives such as the conductive material 50 and the standoff adhesive 34 may be cured by the hot bar. These adhesives may also be hot melt or thermoplastic adhesives.

It is possible that the two members could be separated in the future, such as if one member or the other failed. The hot bar would be re-used on the assembly and the two members separated as shown in process 98 of FIG. 7. This is an optional process, but does demonstrate an advantage of the process of providing the interconnect in this fashion.

As mentioned above the first and second members may be substrates, such as printed circuit boards. They could also be connectors, integrated circuit components, etc.

It will be appreciated that various of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

The invention claimed is:

1. A printing system, comprising:
   a print head to deliver ink to an image receptor;
   at least one ink reservoir to deliver ink to the print head;
   driving circuitry to provide signals to the print head to control delivery of the ink; and
   a flexible circuit interposed between the print head and the ink reservoir to connect the driving circuitry to the print head, the flexible circuit further comprising:
      a first surface upon which are formed contact pads to connect to the print head; and
      a second surface opposite the first surface upon which resides a heater to provide heat to the print head.

2. The printing system of claim 1, the flexible cable further having ink ports to allow ink to flow from the reservoir to the print head.

3. The printing system of claim 1, the heater further comprising traces of copper.

4. The printing system of claim 1, the heater further comprising traces of a nickel-based alloy with chromium and iron.

5. The printing system of claim 1, further comprising a layer of adhesive between the flexible circuit and the print head, wherein the adhesive layer has vias to allow connection between the contact pads and actuators on the print head.

6. The printing system of claim 5, the adhesive layer further comprising a conductive adhesive material to provide electrical connection between the contact pads and the actuators.

7. The printing system of claim 5, the layer of adhesive further comprising an electrically insulating adhesive layer.

8. A printing system, comprising:
   a print head to deliver ink to an image receptor;
   at least one ink reservoir to deliver ink to the print head;
   a rigid substrate inserted into the print head and flexed to conform to contours of the print head;

driving circuitry arranged on the rigid substrate to provide driving signals to the print head.

9. The printing system of claim 8, the print head further comprising an array of ink outlets, each ink outlet having a corresponding actuator, the rigid substrate having contact pads to connect to each actuator.

10. The printing system of claim 8, the print head further comprising a layer of adhesive between the rigid substrate and the print head, the layer of adhesive having holes to allow contact between contact pads on the substrate and actuators on the print head.

11. The printing system of claim 10, the print head further comprising conductive adhesive material in the holes to electrically connect the contact pads and the actuators.

12. The printing system of claim 8, the rigid substrate further comprising a layered substrate such that at least one layer comprises an ink heater.

13. The printing system of claim 12, the ink heater further comprising a continuous copper trace.

14. The printing system of claim 12, the ink heater further comprising multiple layers in the layered substrate.

\* \* \* \* \*